United States Patent
Ilchenko et al.

(10) Patent No.: US 7,187,870 B2
(45) Date of Patent: Mar. 6, 2007

(54) TUNABLE BALANCED OPTO-ELECTRONIC FILTERS AND APPLICATIONS IN OPTO-ELECTRONIC OSCILLATORS

(75) Inventors: Vladimir Ilchenko, Arcadia, CA (US); Lutfollah Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 0 days.

(21) Appl. No.: 10/963,755

(22) Filed: Oct. 12, 2004

(65) Prior Publication Data

US 2005/0123306 A1 Jun. 9, 2005

Related U.S. Application Data

(60) Provisional application No. 60/511,431, filed on Oct. 15, 2003.

(51) Int. Cl.
*H04B 10/00* (2006.01)
(52) U.S. Cl. .................................................. 398/161
(58) Field of Classification Search ........ 398/140–201; 359/337, 234, 359; 250/227; 385/27; 372/32–35
See application file for complete search history.

(56) References Cited

U.S. PATENT DOCUMENTS

| | | | |
|---|---|---|---|
| 5,594,577 A * | 1/1997 | Majima et al. ............... | 398/79 |
| 5,723,856 A | 3/1998 | Yao et al. | |
| 5,777,778 A | 7/1998 | Yao | |
| 5,917,179 A | 6/1999 | Yao | |
| 5,929,430 A | 7/1999 | Yao et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,138,076 A1 | 3/2003 | Yao | |
| 6,535,328 B2 | 3/2003 | Yao | |
| 6,567,432 B1 * | 5/2003 | Kim et al. ................. | 372/6 |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 | 7/2004 | Maleki et al. | |
| 6,907,156 B1 * | 6/2005 | Madsen ..................... | 385/24 |
| 2002/0018611 A1 | 2/2002 | Maleki et al. | |
| 2003/0012504 A1 | 1/2003 | Itchenko | |

FOREIGN PATENT DOCUMENTS

| | | |
|---|---|---|
| EP | 1 158 318 | 11/2001 |
| WO | WO 01/96936 | 12/2001 |

* cited by examiner

*Primary Examiner*—Jason Chan
*Assistant Examiner*—David Lee
(74) *Attorney, Agent, or Firm*—Fish & Richardson P.C.

(57) ABSTRACT

Devices and techniques for achieving signal filtering in RF or microwave frequencies by optical filtering via two optical resonators in two separate optical paths. One optical resonator is tunable to tune the filtering in RF or microwave frequencies. Tunable opto-electronic oscillators may be constructed based on described filters.

31 Claims, 6 Drawing Sheets

TUNABLE BALANCED OPTO-ELECTRONIC FILTERS AND APPLICATIONS IN OPTO-ELECTRONIC OSCILLATORS

This application claims the benefit of U.S. Provisional Patent Application No. 60/511,431 entitled "BALANCED OPTO-ELECTRONIC FILTER FOR TUNABLE OPTO-ELECTRONIC OSCILLATOR" and filed Oct. 15, 2003, the entire disclosure of which is incorporated herein by reference as part of the specification of this application.

FEDERALLY FUNDED RESEARCH STATEMENT

The research and development for inventions described in this application received funding under Contract No. DAAD17-02-C-0085 from Army Research Laboratory. The U.S. Government may have rights to certain technical features described in this application.

BACKGROUND

This application relates to optical and photonic devices for various applications, such as optical, radio frequency (RF), and microwave applications.

Optical devices may be used to manipulate or control light for applications where signals are not in the optical frequencies. As an example, RF and microwave oscillators for generating signals in the RF and microwave frequencies may be constructed as "hybrid" devices by using both electronic and optical components to form opto-electronic oscillators ("OEOs"). See, e.g., U.S. Pat. Nos. 5,723,856, 5,777,778, 5,929,430, and 6,567,436. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The feedback loop produces a desired long delay in the optical part of the loop to suppress phase noise and feeds the converted electrical signal in phase to the modulator to generate and sustain both optical modulation and electrical oscillation in RF or microwave frequencies when the total loop gain of the active opto-electronic loop and any other additional feedback loops exceeds the total loss. The generated oscillating signals are tunable in frequency and can have narrow spectral linewidths and low phase noise in comparison with the signals produced by other RF and microwaves oscillators.

SUMMARY

This application describes, among others, tunable filters in, e.g., RF and microwave frequencies and their applications such as tunable opto-electronic oscillators. The described tunable filters are designed to perform the filtering and tuning of RF and microwave signal optically.

In one implementation, an optical carrier beam at an optical carrier frequency is split into a first beam and a second beam. The optical carrier beam is modulated to carry a plurality of signal bands at frequencies different from the optical carrier frequency. The first beam is directed through a first optical path to transmit only light at the optical carrier frequency. The second beam is directed through a second, separate optical path to transmit only light at a selected signal band. The transmitted light from the first and second optical paths are combined to produce an optical output. An optical detector is used to receive the optical output and to recover the selected signal band.

A device is described to include an input port to receive an input optical beam at an optical carrier frequency, a first optical path, and a second optical path. The first optical path is coupled to the input port to receive a first portion of the input optical signal and includes a first optical resonator locked in frequency to be resonant at the optical carrier frequency to transmit light at the optical carrier frequency through the first optical path. The second optical path is coupled to the input port to receive a second portion of the input optical signal and includes a second optical resonator, which is tunable to be in resonance with light at a selected optical frequency different from the optical carrier frequency, to transmit light at the selected optical frequency through the second optical path. This device also includes an output port coupled to the first and second optical paths to combine transmitted light from the first and second optical paths to produce an output optical beam, and an optical detector to convert the output optical beam into a detector output carrying a signal at a frequency that is a difference between the optical carrier frequency and the selected optical frequency.

The above device may further include an optical modulator located to modulate light before the light enters the second optical resonator in response to a modulation control signal to produce a modulated optical beam at least part of which is directed into the second optical resonator. The optical modulator may be located to modulate light prior to entry of the input port or located in the second optical path between the input port and the second optical resonator. A feedback unit may be provided to supply the modulation control signal to form an opto-electronic oscillator.

This application describes another device which includes equal first and second optical paths that respectively include first and second optical resonators. The two optical paths split an input optical beam into a first optical beam into the first optical path and a second optical beam into the second optical path, and to combine light from the first and second optical paths as an optical output. The first optical resonator is coupled in the first optical path and locked to an optical carrier frequency of the input optical beam. The second optical resonator is coupled in the second optical path and is configured to exhibit an electro-optic effect and tunable in response to an electrical tuning signal to change a spectral difference of a resonance in the second optical resonator closest to the optical carrier frequency.

This application further describes a device that includes an input port to receive an input optical beam at an optical carrier frequency, a first optical path coupled to the input port to receive a first portion of the input optical signal and comprising a first optical resonator at a first resonance frequency to transmit light at the first resonance frequency through the first optical path, and a second optical path coupled to the input port to receive a second portion of the input optical signal and comprising a second optical resonator. The second optical resonator is tunable to be in resonance with light at a second resonance frequency different from the first resonance frequency and to transmit light at the second resonance frequency through the second optical path. An output port is coupled to the first and second optical paths to combine transmitted light from the first and second optical paths to produce an output optical beam.

Yet another device described includes means for splitting an optical carrier beam at an optical carrier frequency into a first beam and a second beam, means for modulating at least the second beam to carry a plurality of signal bands at frequencies different from the optical carrier frequency, means for directing the first beam through a first optical path to transmit only light at the optical carrier frequency, means for directing the second beam through a second, separate optical path to transmit only light at a selected signal band, means for combining transmitted light from the first and second optical paths to produce an optical output, and means for converting the optical output into an electrical signal to recover the selected signal band.

These and other implementations and their applications are described in greater detail in the attached drawings, the following detailed description, and the claims.

DETAILED DESCRIPTION

Figure 1:
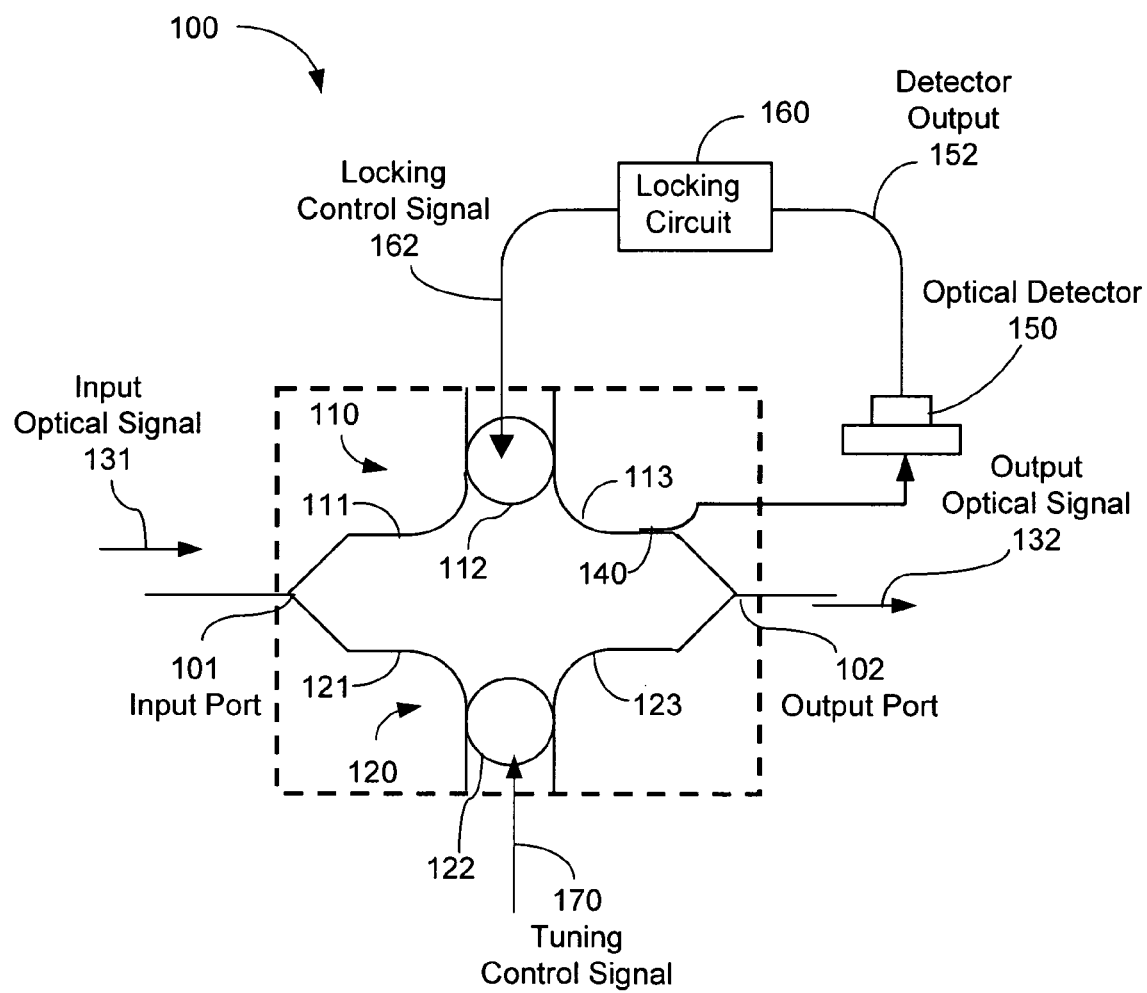
FIG. 1 shows an example of a tunable RF or microwave filter based on optical filtering with two optical resonators.

The techniques and devices described in this application use two optical resonators as passband filters to filter light in two optical paths to effectuate a tunable filter. In implementation, such devices may use an input port to receive an input optical beam, a first optical path coupled to the input port to receive a first portion of the input optical signal, and a second optical path coupled to the input port to receive a second portion of the input optical signal. The first optical path has a first optical resonator at a first resonance frequency to transmit light at the first resonance frequency through the first optical path. The second optical path has a second optical resonator, which is tunable to be in resonance with light at a second resonance frequency different from the first resonance frequency, to transmit light at the second resonance frequency through the second optical path. An output port is coupled to the first and second optical paths to combine transmitted light from the first and second optical paths to produce an output optical beam.

Therefore, the output optical beam in the output port must have two spectral components at the resonance frequencies of the first and second resonators. When an optical detector is used to receive the output optical beam, the beat signal of two spectral components in a photodetector is converted into RF signal at the beat frequency which is a difference between the first and second optical resonance frequencies. When the second optical resonator is tuned relative to the first optical resonator, the allowed beat frequency of the converted signal changes accordingly to provide a tunable filtering operation. The detuning between the first and second optical resonators may be in the RF or microwave frequencies by controlling the frequency difference between the resonators as an RF or microwave passband or notch filter. Different from conventional RF or microwave notch filters, the devices described here perform the filtering in the optical domain by filtering light carrying the RF or microwave signals through two optical resonators in order to effectuate filtering in the RF or microwave domain.

For example, an optical beam at an optical carrier frequency may be modulated to include sidebands to carry RF or microwave signals. The first optical resonator may be locked in frequency to the optical carrier frequency. The second optical resonator may be tuned to select a desired sideband to transmit to the output port while rejecting the optical components at the optical carrier frequency and other sidebands. At the optical detector, the RF or microwave signal in the selected sideband is detected due to the beating between the optical carrier selected by the first optical resonator and the sideband selected by the second optical resonator. The first and second optical resonators may be designed to have sufficiently narrow optical spectral linewidths to transmit only optical spectral components within a selected band while rejecting light from adjacent bands.

FIG. 1 shows a tunable filter 100A as one example of the devices described here. The filter 100A has an optical input port 101 to receive an input optical signal 131 and an optical output port 102 to export an output signal 132. The input port 101 is coupled to first and second optical paths 110 and 120, respectively, to split the input signal 131 into a first signal to the first optical path 110 and a second optical signal to the second optical path 120. The two optical paths 110 and 120 are combined at the output port 102. In the examples described here, the fist and second optical paths 110 and 120 have equal optical path lengths but different optical spectral transmission properties.

The first optical path 110 as illustrated includes optical path 111, a first optical resonator 112, and a second optical path 113 optically connected in series. The optical paths 111 and 113 may be waveguides such as waveguides formed on a substrate or fibers. The first optical resonator 112 is optically connected between the paths 111 and 113 to filter light from the path 111 and sends transmitted light to the path 113. As illustrated, the optical resonator 112 may be a ring resonator, a whispering gallery mode sphere resonator, or a whispering gallery mode disk resonator. The coupling between the resonator 112 and the paths 111 and 113 may be evanescent coupling. The second optical path 120 is similarly constructed with a first optical path 121, a second optical resonator 122, and a second optical path 123 optically connected in series between the input port 101 and the output port 102. To a certain extent, the general optical layout of this two-path design resembles a typical optical Mach-Zehnder interferometer which operates by splitting an optical beam into two optical paths and then combining the light from the two optical paths together to interfere. The presence of the first and second optical resonators 112 and 122, however, makes the filter 110A very different from Mach-Zehnder interferometers in device structure, device operation, and device function.

The first optical resonator 112 may be a tunable resonator and the first resonance frequency is controlled or stabilized at a desired reference frequency. The second optical resonator 122 is then tuned relative to the first resonance frequency to select a sideband carried the input signal 131. In many applications, the first resonance frequency is locked to the optical carrier frequency in the input signal 131 by, for example, dynamically adjusting the first optical resonator to reduce any deviation in frequency from the optical carrier frequency.

FIG. 1 shows a feedback locking circuit 160 for such dynamic control of the first resonator 112. An optical coupler 140 is used to tap a fraction of light transmitted through the first optical resonator 112 in the path 113. An optical detector 150 is used to convert the received light into a detector output 152. The locking circuit 160 produces a locking control signal 162 in response to the detector output 152 to adjust the resonance frequency of the resonator 112. The resonator 112 may be tunable by a suitably tuning mechanism, e.g., by thermal control of the resonator whose index, dimension, or both change with temperature, mechanical control of the resonator by changing the dimension of the resonator, electrical control, or optical control. More specifically, an electro-optic material may be used in the resonator 122 to control and tune the resonance frequency by an external control signal. The resonator 112 may be a tunable WGM resonator. Similarly, the resonator 122 in the second optical path 120 may also be tuned by any of the tuning methods described above. To tune the filter 100A, an external tuning control signal 170 is applied to the resonator 122 to tune the frequency spacing between the first and second resonance frequencies.

For example, both resonators 112 and 122 may be tunable electro-optic resonators. Under this implementation, the filter 100A is an electro-optically tunable filter to serve as side-band frequency selective element in photonic RF or microwave systems. An Opto-Electronic Oscillator (OEO) may include one electro-optic filter based on high-Q lithium niobate resonators in the configuration in FIG. 1. In one implementation of the design in FIG. 1, an electro-optically tunable photonic RF filter is based on the balanced operation of two identical Electro-Optical (EO) resonators 112 and 122 serving as optical filter elements in equal arms 110 and 120 of a Mach-Zender interferometer. The free spectral range (FSR) of the resonators 112 and 122 is chosen to exceed the doubled maximum operational frequency of the filter. As an example, the FSR of each resonator should be 30 GHz for stable operation of the filter in a tuning range of 0–15 GHz. One of the arms of the interferometer has a tapping coupler that allows to lock the resonator 112 in the corresponding arm by adjusting the DC voltage applied to the resonator 112 so as to maintain constant transmission of the laser power at its frequency serving as eventual optical carrier frequency for operation of the photonic filter or OEO. A second DC control voltage can be applied to the second resonator 122 to change the relative position of its closest optical resonance with respect to the optical carrier, and thereby define the operational frequency of the photonic filter or OEO. This voltage will also track the variations of the locking DC voltage of the carrier-stabilized OE resonator 112. Because one of the resonators 112 and 122, i.e., the resonator 112 in the illustrated examples, is locked to track the frequency of the input laser, the tuning control voltage on the second filter 122 is corrected correspondingly to maintain the desired frequency offset which is the target RF frequency of the sideband filtering. For example, if the electrical sensitivities of the two tunable resonators 112 and 122 are equal, the tuning control voltage 170 applied to the resonator 122 can be the sum of an external proportional regulation voltage and a copy of the locking control signal 162 where the copy of the signal 162 sets the resonator 122 at the same resonance of the resonator 112 in tracking the input laser frequency while the external regulation voltage provides the detuning in the resonator 122 from the resonance of the resonator 112 to target a desired RF or WM frequency to filter. A separate control circuit is used to generate this control voltage 170. Both signals from the two optical arms recombine at the output port 102 with an equal phase after the Mach-Zender interferometer, and can then be detected for the filtering operation, or delayed and detected for the subsequent feedback into an optical modulator in an opto-electronic oscillator. This balanced design may be used to achieve two main goals among other operation features and advantages. First, the discriminated phase noise of the laser that would otherwise be observed at the detector after the filter can be minimized or canceled as the parasitic amplitude modulation. Second, the relative thermal detuning between the two resonators 112 and 122 can be minimized by placing both resonators 112 and 122 on a relatively massive common substrate with a very high thermal conductivity.

Figure 2:
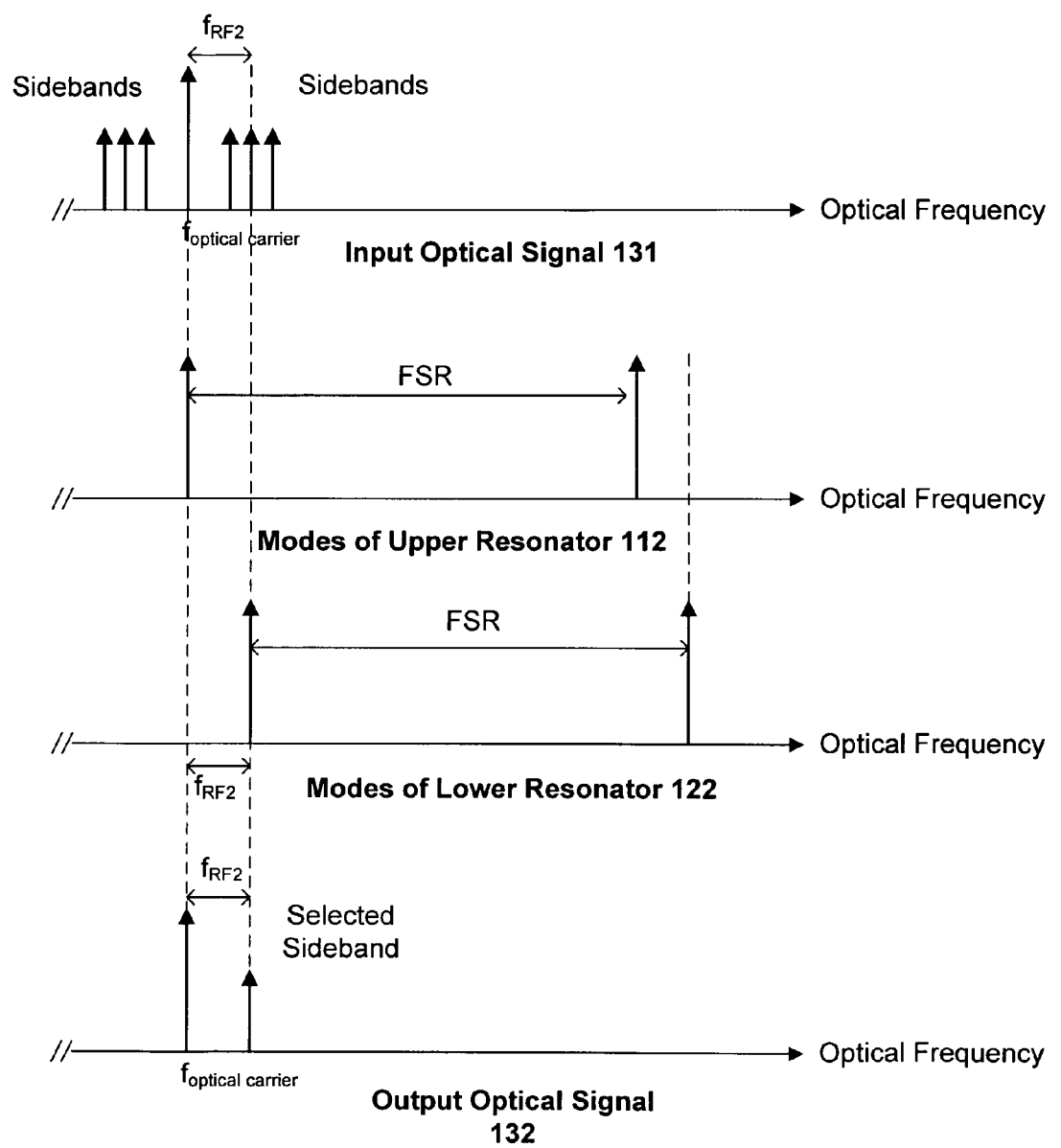
FIG. 2 illustrate the operation of the tunable filters in FIG. 1.

FIG. 2 illustrates the operation of the filter 100 in FIG. 1. Assume the input signal 131 has multiple sidebands that carry information on a beam at an optical carrier frequency. The resonator 112 is tuned so that one resonance peak is at the optical carrier frequency. The light at the optical carrier frequency is selected by the resonator 112 to transmit and the sidebands at other frequencies are rejected. The resonator 122 is detuned by a desired RF or microwave frequency from the resonance frequency of the resonator 112 to select one sideband to transmit while rejecting other sidebands and the optical carrier. Thus, the optical output 132 has both the optical carrier and the selected sideband. When the output 132 is detected by an optical detector, the sideband at the RF or microwave frequency is recovered. The FSR of the resonators 112 and 122 is designed according to the desired continuous tuning range of the filter and is at least twice of the tuning range.

Figure 3:
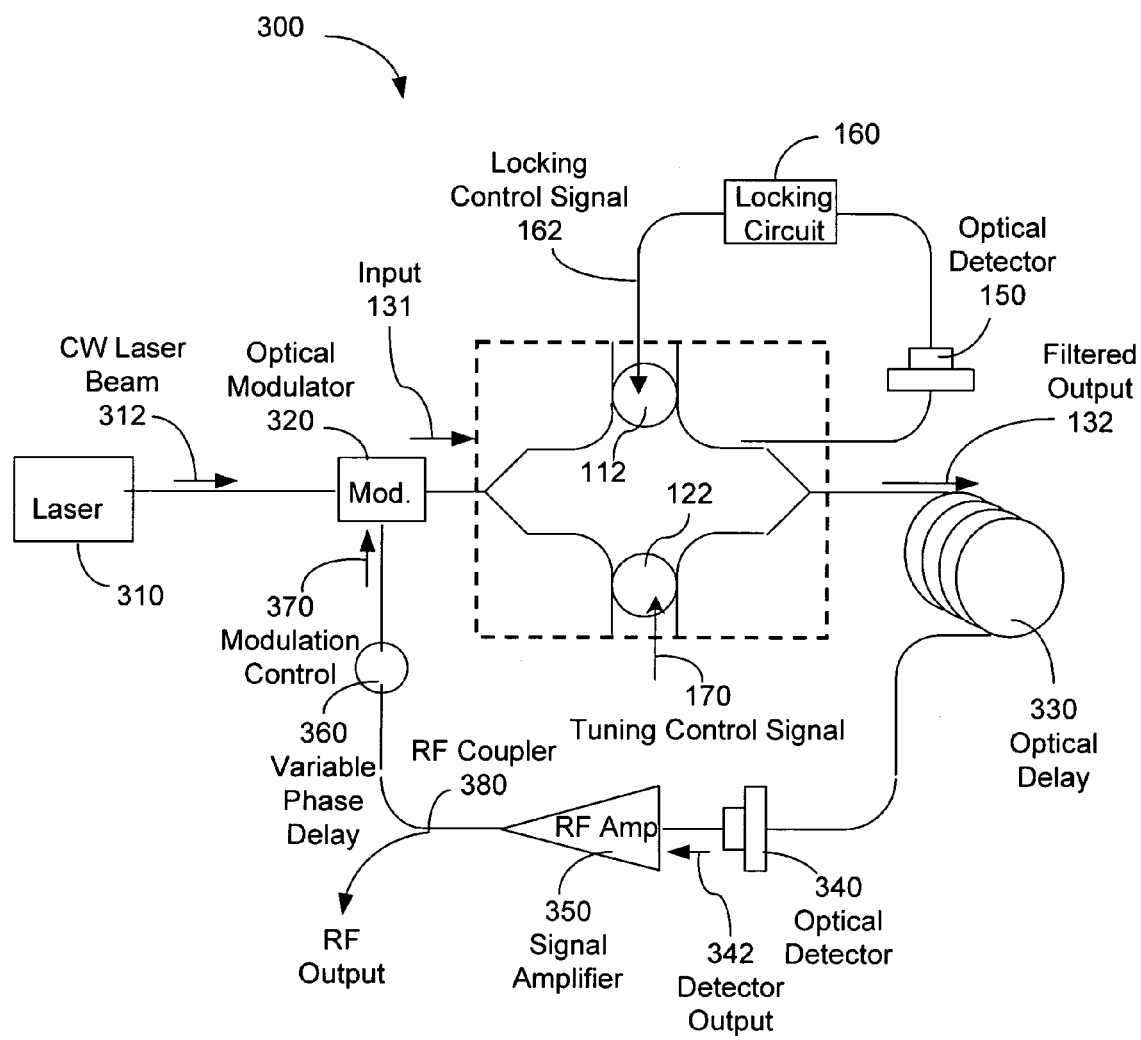
FIG. 3 shows a tunable opto-electronic oscillator that uses a tunable filter described in this application.

The above tunable filters may be used in opto-electronic oscillators. FIG. 3 shows one OEO 300 where an optical modulator 320 receives and responds to a modulation control signal 370 to modulate a CW beam 312 from a light source 310 such as a laser. This optical modulation produces an input beam 131. Next to the optical modulator 320 is the tunable optical filter shown in FIG. 1. The optical output 132 of the filter is directed into an optical delay element 330, which may be, e.g., a fiber delay line or an optical resonator, to produce a desired long delay to suppress noise in the oscillator 300. When the optical delay 330 is an optical resonator, certain phase matching conditions must be met. See, e.g., U.S. Pat. No. 6,567,436, the entire disclosure of which is incorporated herein by reference. An optical detector 340 is used to receive the optical output from the optical delay 330 and produces a detector output 342. This detector 340 is an interface from the optical portion of the OEO 300 to an electrical portion that connects between the optical modulator 320 and the detector 340. The detector output 342 is conditioned in the electrical portion to produce the modulation control signal 370 for the optical modulator 320. In the illustrated example, the electrical portion includes a signal amplifier 350 (e.g., an RF amplifier) and a variable phase delay 360. Hence, the opto-electronic feedback loop in the OEO 300 includes the optical modulator 320 as the interface from the electrical portion to the optical portion, the tunable filter, the optical delay 330, and the optical detector 340. The total loop gain is greater than the losses and the feedback is in phase so that an oscillation at the frequency determined by the difference between the first and second resonance frequencies of the resonators 112 and 122 can be sustained. The energy of the oscillation is obtained from the light source 310 and the amplifier 350. The oscillating signal from the OEO 300 is tunable in frequency by tuning the resonator 122. The optical signal in the OEO 300 can be tapped at any location in the optical section of the feedback loop to produce an optical output. Similarly, the electrical oscillation signal in the electrical portion of the feedback loop may be tapped to produce an RF or microwave output, e.g., by using a signal coupler 380 at the output of the amplifier 350.

Figure 4:
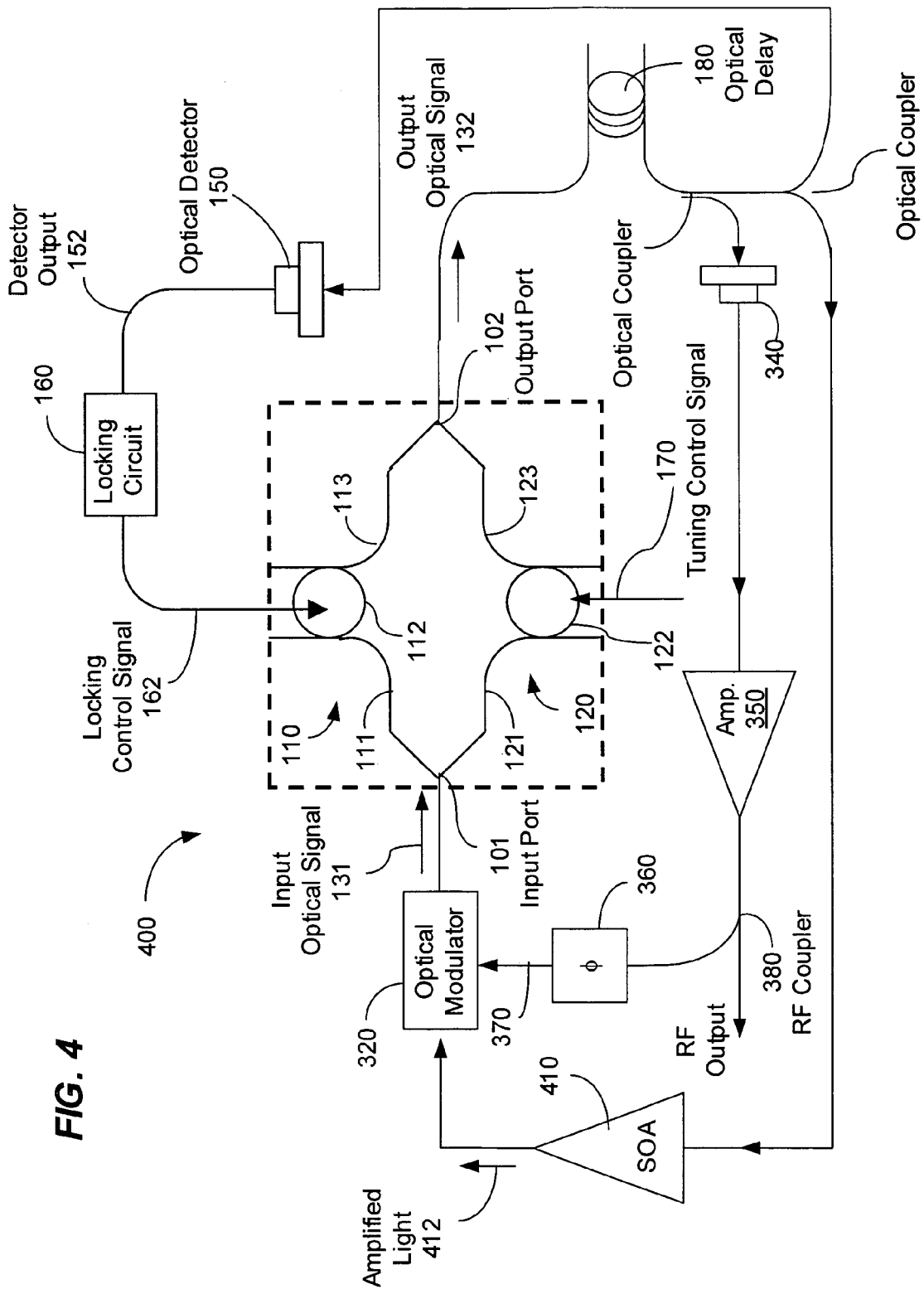
FIG. 4 shows a tunable coupled opto-electronic oscillator that uses a tunable filter described in this application.

FIG. 4 shows an example of a coupled OEO 400 that uses the tunable filter in FIG. 1. Referring to U.S. Pat. Nos. 5,929,430, and 6,567,436, a COEO directly couples a laser oscillation in an optical feedback loop to an electrical oscillation in an opto-electronic feedback loop. The laser oscillation and the electrical oscillation are correlated with each other so that both the modes and stability of one oscillation are coupled with those of the other oscillation.

In the specific example shown in FIG. 4, the optical feedback loop forms a ring laser cavity and includes the optical modulator 320, the tunable filter 100 in FIG. 1, and an optical gain medium 410, e.g., a semiconductor optical amplifier (SOA). The optical gain medium 410 amplifies the output light from the optical delay element 180 to produce the amplified light 412 as the input to the optical modulator. The optical gain from the gain medium 410 is greater than the optical losses in the loop to effectuate the laser oscillation. The opto-electronic loop in the COEO 400 includes the optical modulator 320, the tunable filter 100 in FIG. 1, the optical delay 180, the optical detector 340, and the electrical portion of the feedback (e.g., the amplifier 350 and the variable phase delay 360). The two loops are share the optical modulator 320, the tunable filter, and the optical delay 180. The open loop gain in the opto-electronic loop also exceeds the loss to sustain the electrical oscillation. The coupling between two feedback loops is achieved at the optical modulator 320 which modulates the gain in the optical loop by the modulation control signal generated by the opto-electronic feedback loop.

Figure 5:
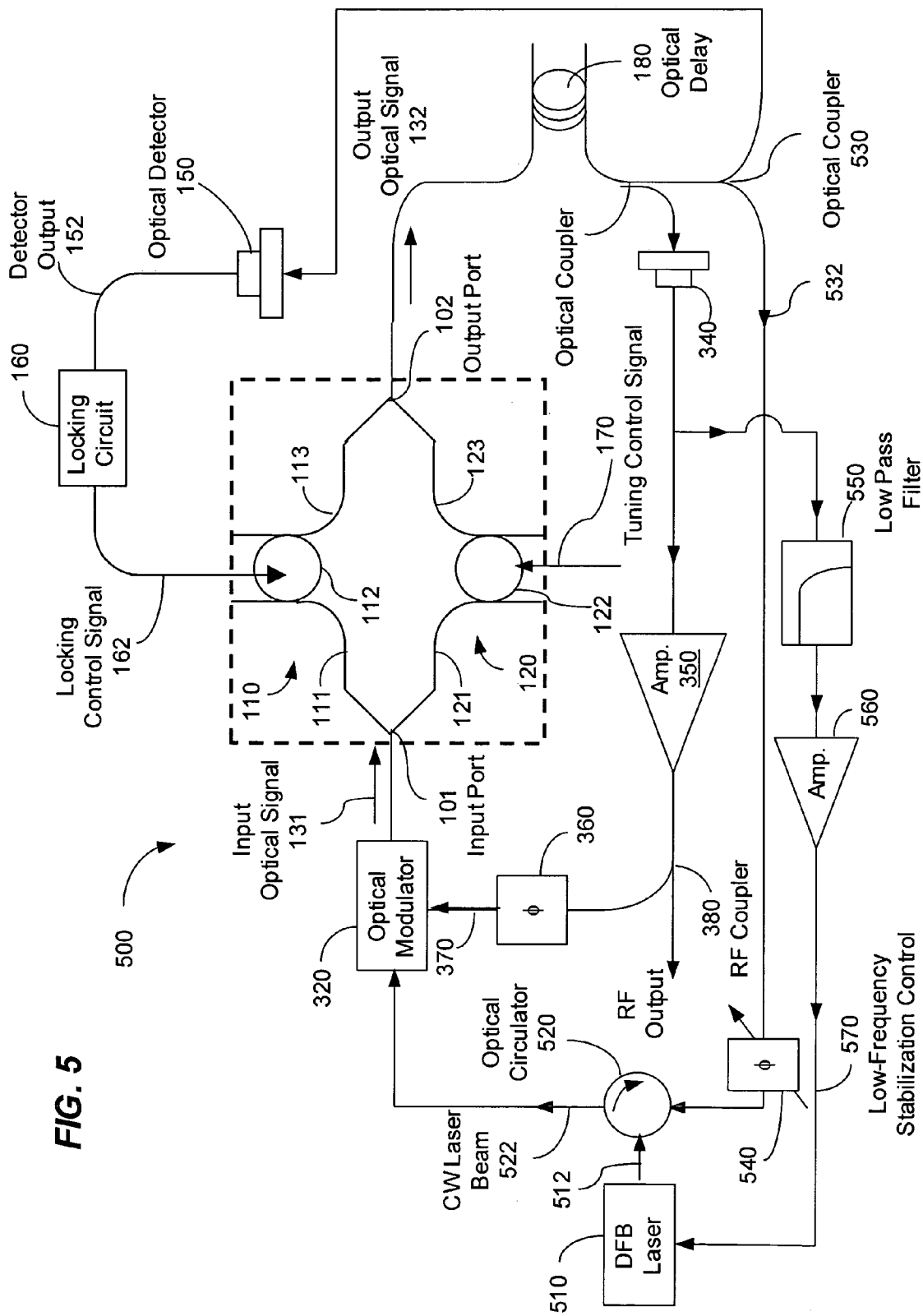
FIG. 5 shows a tunable opto-electronic oscillator that uses a tunable filter described in this application and a self-injection mechanism to stabilize the laser source.

FIG. 5 shows another example of an OEO 500 that further uses optical self injection to stabilize a laser 510 that produces the CW light supplied to the opto-electronic loop. The OEO 500 uses a tunable laser, such as a distributed feedback (DFB) semiconductor laser, as the laser 510 to produce the CW laser beam 522. The laser 510 has an output optical port 512 that exports the laser beam 522. In self injection locking, an external optical beam is injected back into the laser cavity via the output optical port 512 to stabilize the laser. In OEO 500, the optical signal in the optical section of the opto-electronic feedback loop is injected back to the laser 510 via the port 512 to stabilize the laser 510. An optical circulator 520 or another other suitable optical routing device may be used to direct the output beam 522 to the optical modulator 320 of the OEO 500 and to direct a portion of the optical signal in the OE loop to the laser 510. As illustrated, an optical coupler 530 is used to split a portion of the optical output from the optical delay 180 to produce the feedback optical signal 532. The optical circulator 520 directs the signal 532 into the laser 510. An optional variable optical phase delay 540 may be placed in the optical path of the optical feedback signal 532 to adjust the phase of the signal 532 for injection locking in the laser 510.

The laser 510 may exhibit low frequency drafts in its power and frequency due to various factors such as a change in temperature in the laser cavity. Such a drift may cause the laser 510 out of the locking condition by the optical injection. A low-frequency stabilization control mechanism, hence, may be provided to mitigate such drifts and to maintain the laser 510 locked in frequency. As illustrated, a portion of the detector output from the detector 340 in the electrical portion of the opto-electronic feedback may be processed to extract the low frequency component of the signal as a feedback signal to control the laser 510 so that the laser is adjusted to compensate for the drift. A low pass filter 550 may be used to filter the signal from the detector 340 where high frequency components are removed. Next, a signal amplifier 560 is used to amplify the filtered signal to produce the final feedback control signal 570 to the laser 510. As an example, this signal 570 is used to control the driving current to a DFB semiconductor laser used as the laser 510.

The above examples of OEO devices using the tunable filters described here use the opto-electronic feedback loop as the sole feedback loop to control the oscillation. One or more additional feedback loops may be used to control the optical modulator in the opto-electronic feedback loop to form multi-loop OEOs with the above tunable filters. Various multi-loop OEOs are described in U.S. Pat. No. 5,777,778 which is incorporated herein by reference. In a multi-loop OEO, the different feedback loops have different delays. The opto-electronic feedback loop with the longest delay is used to achieve low phase noise and narrow spectral linewidth. This loop is also used to provide fine frequency tuning since its mode spacing is smaller than any of the other feedback loops. On the other hand, the feedback loop with the shortest delay and the widest mode spacing, either opto-electronic or purely electronic, is used to provide a coarse frequency tuning to achieve a wide continuous tuning range. The total open loop gain of the multiple loops must exceed the total losses to sustain an opto-electronic oscillation but each loop may have an open loop gain less than the loss in that loop.

The optical delay element 330 in FIG. 3 or 180 in FIGS. 4 and 5 may be an optical resonator with a high quality factor and a low optical loss. A fiber ring cavity or a fiber Fabry-Perot cavity, for example, may be used as the optical delay 330 or 180. In one specific implementation, the delay element 330 or 180 may be a fiber cavity formed from a 20-meter fiber to have a free spectral range of about 10 MHz and a finesse of about 125. The optical coupling for the optical delay element 330 or 180 may be weak to maintain the high quality factor of the cavity.

The optical modulator 320 in the above described devices may be alternatively placed in the lower optical path 121 between the input port 101 and the tunable resonator 122. For example, the devices shown in FIGS. 4 and 5 may use this configuration.

In the above devices, the tunable resonators 112 and 122 may be implemented in various configurations, including ring resonators and whispering gallery mode (WGM) resonators. A suitable ring resonator may be formed in waveguide rings like fiber rings. A WGM resonator may be implemented in a number of configurations, including, microsphere WGM resonators, microdisk WGM resonators with spherical and non-spherical exterior surfaces, and microring WGM resonators with spherical and non-spherical exterior surfaces. The non-spherical exterior surfaces may be spheriodal surfaces of spheroids or conic surfaces. See, e.g., U.S. Pat. No. 6,795,481.

A tunable resonator suitable for the above devices and their variations may be implemented in various configurations. When a tunable WGM resonator is used, for example, the tuning may be achieved by thermal control of the resonator whose index, dimension, or both change with temperature, mechanical control of the resonator by changing the dimension of the resonator, electrical control, or optical control. Electro-optic materials may be used to control and tune the resonance frequency of the WGM resonator by an external control signal.

Figure 6A:
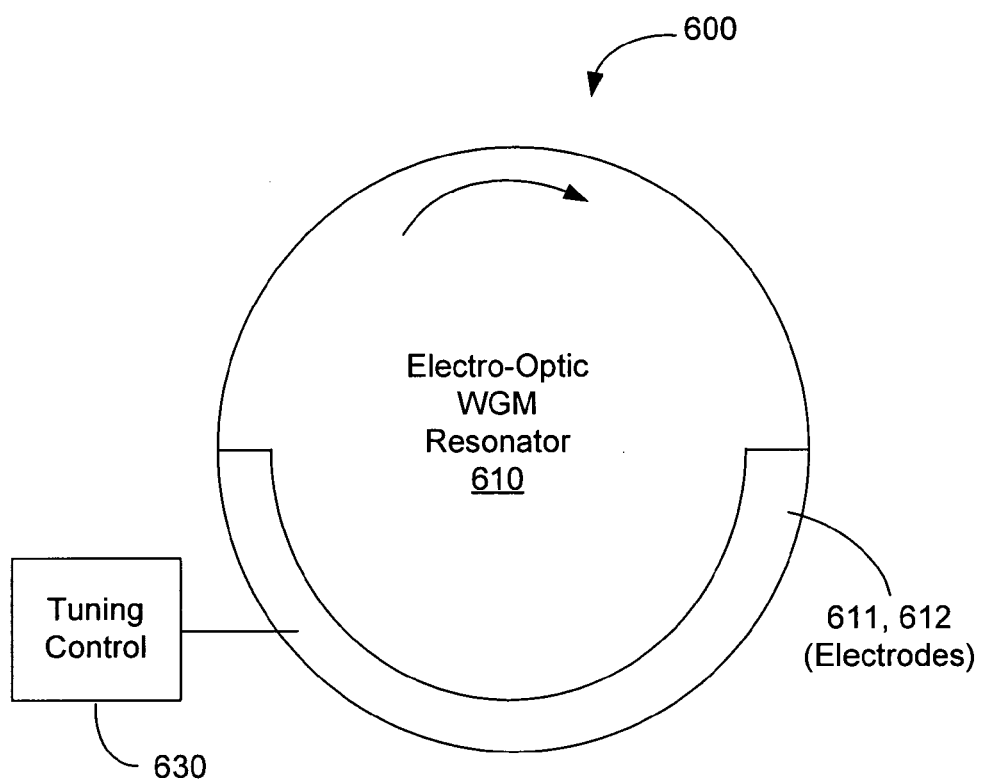
FIGS. 6A and 6B illustrate an example of a tunable whispering gallery mode optical resonator based on an electro-optic effect.
Figure 6B:
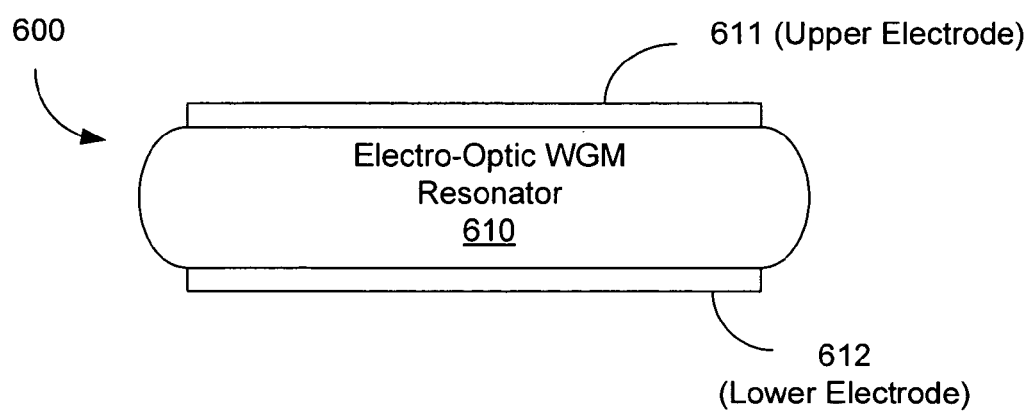

FIGS. 6A and 6B show an example of a tunable electro-optic WGM resonator 600 having a WGM resonator 610. The electro-optic material for the entire or part of the resonator 610 may be any suitable material, including an electro-optic crystal such as Lithium Niobate ("Lithium Niobate resonator") and semiconductor multiple quantum well structures. One or more electrodes 611 and 612 may be formed on the resonator 610 to apply a control electrical field in at least the region where the WG modes are present to control the index of the electro-optical material and to change the filter function of the resonator. Assuming the resonator 610 has disk or ring geometry, the electrode 611 may be formed on the top of the resonator 610 and the electrode 512 may be formed on the bottom of the resonator 610 as illustrated in the side view of the device in FIG. 6B. In one implementation, the electrodes 611 and 612 may constitute an RF or microwave resonator to apply the RF or microwave signal to co-propagate along with the desired optical WG mode. For example, the electrodes 611 and 612 may be microstrip line electrodes. The electrodes 611 and 612 may also form an electrical waveguide to direct the electrical control signal to propagate along the paths of the WG modes. A tuning control unit 630 such as a control circuit may be used to supply the electrical control signal to the electrodes 611 and 612.

In operating the tunable resonator 600, the control unit 630 may supply a voltage as the electrical control signal to the electrodes 611 and 612. The control voltage may be a DC voltage to set the resonance peak of the resonator 600 at a desired spectral location. The DC voltage may be adjusted by the control unit 630 to tune the spectral position of the transmission peak when such tuning is needed. For dynamic tuning operations, the control unit 630 adjusts the control voltage in response to a control signal to, e.g., maintain the transmission peak at a desired spectral position or frequency or to change the frequency of the transmission peak to a target position. In some other operations, the control unit 630 may adjust the control voltage in a time varying manner, e.g., scanning the transmission peak at a fixed or varying speed or constantly changing the transmission peak in a predetermined manner.

For example, a Z-cut LiNbO$_3$ disk cavity with a diameter of d=4.8 mm and a thickness of 170 μm may be used as the resonator 610. The cavity perimeter edge may be prepared in the toroidal shape with a 100 μm radius of curvature. As an alternative to the strip electrodes shown in FIG. 6A, the top and bottom surfaces of the disk resonator may be coated with conductive layers for receiving the external electrical control signal. A metal such as indium may be used to form the conductive coatings. Tuning is achieved by applying and adjusting a voltage to the top and bottom conductive coatings. Each conductive coating may be absent on the central part of the resonator and are present at the perimeter edge of the resonator where WGMs are localized.

In summary, only a few implementations are disclosed. However, it is understood that variations and enhancements may be made.

What is claimed is:

1. A device, comprising:
    an input port to receive an input optical beam at an optical carrier frequency;
    a first optical path coupled to the input port to receive a first portion of the input optical signal and comprising a first optical resonator locked in frequency to be resonant at the optical carrier frequency to transmit light at the optical carrier frequency through the first optical path;
    a second optical path coupled to the input port to receive a second portion of the input optical signal and comprising a second optical resonator, which is tunable to be in resonance with light at a selected optical frequency different from the optical carrier frequency, to transmit light at the selected optical frequency through the second optical path;
    an output port coupled to the first and second optical paths to combine transmitted light from the first and second optical paths to produce an output optical beam; and
    an optical detector to convert the output optical beam into a detector output carrying a signal at a frequency that is a difference between the optical carrier frequency and the selected optical frequency.

2. The device as in claim 1, wherein the second optical resonator has a frequency tuning range in which the resonance frequency of the second optical resonator is tuned, and wherein the each of the first and second optical resonators has a tree spectral range greater than at least twice of the frequency tuning range.

3. The device as in claim 1, further comprising an optical delay element coupled between the output port and the detector to cause an optical delay in the output optical beam at the detector.

4. The device as in claim 3, wherein the optical delay element comprises a spool of fiber.

5. The device as in claim 3, wherein the optical delay element comprises a fiber cavity.

6. The device as in claim 3, further comprising:
    an optical modulator to modulate light in response to a modulation control signal to produce a modulated optical beam as the input optical beam to the input port; and
    a feedback unit to receive the detector output and to produce the modulation control signal from the detector output.

7. The device as in claim 6, wherein the feedback unit comprises a signal amplifier.

8. The device as in claim 6, wherein the optical modulator, the first and second optical paths, the optical delay element, the optical detector, and the feedback unit form an opto-electronic oscillator to sustain an oscillation at a frequency that is a difference between the optical carrier frequency and the optical frequency selected by the second optical resonator.

9. The device as in claim 6, further comprising:
    a first optical detector to receive a portion of light in the first optical path and to convert the portion of light into a first detector signal; and
    a locking circuit to receive and process the first detector signal to produce a first control signal and operable to apply the first control signal to lock the first optical resonator at the optical carrier frequency.

10. The device as in claim 6, further Comprising:
    a first optical detector to receive a portion of light transmitting through the optical delay element and to convert the portion of light into a first detector signal; and
    a locking circuit to receive and process the first detector signal to produce a first control signal and operable to apply the first control signal to lock the first optical resonator at the optical carrier frequency.

11. The device as in claim 10, further comprising:
    a semiconductor optical amplifier (SOA) coupled to receive a portion of light transmitting through the optical delay element and to amplify the received portion of light to produce the light received by and modulated by the optical modulator, wherein the optical modulator, the first and second optical paths, the optical delay element, the optical detector, and the feedback unit form an opto-electronic oscillator to sustain an oscillation at a frequency that is a difference between the optical carrier frequency and the optical frequency selected by the second optical resonator, and wherein the semiconductor optical amplifier, the optical modulator, the first and second optical paths, and the optical delay element form an optical loop to produce laser light.

12. The device as in claim 10, further comprising:

a distributed feedback laser (DFB) comprising a laser output port to produce an output laser beam;

an optical circulator to receive the output laser beam and to direct the output laser beam to the optical modulator as the light received and modulated by the optical modulator; and means for coupling a portion of light transmitting through the optical delay element to produce a laser feedback beam and for directing the laser feedback beam to the optical circulator, wherein the optical circulator is coupled to direct the received laser feedback beam into the laser output port of the distributed feedback laser to optically lock a frequency of the distributed feedback laser.

13. The device as in claim 12, further comprising a variable optical phase element to control a phase of the laser feedback beam.

14. The device as in claim 12, further comprising:

a laser stabilization circuit to receive a portion of the detector output from the optical detector and to use a low-frequency component in the received portion of the detector output to electrically stabilize the distributed feedback laser.

15. The device as in claim 14, wherein the laser stabilization circuit comprises a low-pass filter and an amplifier.

16. The device as in claim 1, further comprising a substrate of a high thermal conductivity on which the first and second optical resonators are placed.

17. The device as in claim 1, further comprising:

a first optical detector to receive a portion of light in the first optical path and to convert the portion of light into a first detector signal; and a locking circuit to receive and process the first detector signal to produce a first control signal and operable to apply the first control signal to lock the first optical resonator at the optical carrier frequency.

18. The device as in claim 17, wherein the first optical resonator exhibits an electro-optic effect, and wherein the locking circuit locks the first optical resonator to the optical carrier frequency by using the first control signal to adjust the first optical resonator via the electro-optic effect.

19. The device as in claim 1, wherein the second optical resonator exhibits an electro-optic effect and is tuned via the elecero-optic effect.

20. The device as in claim 1, wherein the first and second optical resonators are identical.

21. The device as in claim 20, wherein the first and second optical resonators are identical electro-optic resonators.

22. The device as in claim 1, wherein the first and second optical paths comprising the first and second optical resonators, respectively, have an equal optical phase.

23. The device as in claim 1, further comprising:

an optical modulator located to modulate light before the light enters the second optical resonator in response to a modulation control signal to produce a modulated optical beam at least part of which is directed into the second optical resonator.

24. The device as in claim 23, wherein the optical modulator is located to modulate light prior to entry of the input port.

25. The device as in claim 23, wherein the optical modulator is located in the second optical path between the input port and the second optical resonator.

26. A device, comprising:

first and second optical paths to split an input optical beam into a first optical beam into the first optical path and a second optical beam into the second optical path, and to combine light from the first and second optical paths as an optical output;

a first optical resonator coupled in the first optical path and locked to an optical carrier frequency of the input optical beam;

a second optical resonator coupled in the second optical path and configured to exhibit an electro-optic effect and tunable in response to an electrical, tuning signal to change a spectral difference of a resonance in the second optical resonator closest to the optical carrier frequency; and an optical detector to receive the optical output from the first and second optical paths and to convert the optical output into a detector signal carrying a signal at a frequency equal to a difference between the optical carrier frequency and the resonance where the second optical resonator is tuned.

27. The device as in claim 26, further comprising an optical delay element in a path of the optical output to cause a delay in light received by the optical detector.

28. A device, comprising:

first and second optical paths to split an input optical beam into a first optical beam into the first optical path and a second optical beam into the second optical path, and to combine light from the first and second optical paths as an optical output;

a first optical resonator coupled in the first optical path and locked to an optical carrier frequency of the input optical beam;

a second optical resonator coupled in the second optical path and configured to exhibit an electro-optic effect and tunable in response to an electrical tuning signal to change a spectral difference of a resonance in the second optical resonator closest to the optical carrier frequency;

a first optical detector to receive a portion of light transmitting through the first optical resonator in the first optical path and to convert the portion of light into a first detector signal; and a locking circuit to receive and process the first detector signal to produce a first control signal and operable to apply the first control signal to lock the first optical resonator at the optical carrier frequency.

29. The device as in claim 28 wherein the first optical resonator is a tunable electro-optic resonator.

30. A device, comprising:

an input port to receive an input optical beam at an optical carrier frequency;

a first optical path coupled to the input, port to receive a first portion of the input optical signal and comprising a first optical resonator at a first resonance frequency to transmit light at the first resonance frequency through the first optical path;

a second optical path coupled to the input port to receive a second portion of the input optical signal and comprising a second optical resonator, which is tunable to be in resonance with light at a second resonance frequency different from the first resonance frequency, to transmit light at the second resonance frequency through the second optical path;

an output port coupled to the first and second optical paths to combine transmitted light from the first and second optical paths to produce an output optical beam; and an optical detector to convert the output optical beam into a detector output carrying a signal at a frequency that is a difference between the first and second resonance frequencies.

31. The device as in claim 1, further comprising a mechanism to minimize a relative thermal detuning between the first and the second optical resonators.

* * * * *